US00RE43536E

(19) United States
(12) Reissued Patent
Eide

(10) Patent Number: US RE43,536 E
(45) Date of Reissued Patent: Jul. 24, 2012

(54) STACKABLE LAYER CONTAINING BALL GRID ARRAY PACKAGE

(75) Inventor: Floyd Eide, Huntington Beach, CA (US)

(73) Assignee: Aprolase Development Co., LLC, Wilmington, DE (US)

(21) Appl. No.: 12/500,434

(22) Filed: Jul. 9, 2009

Related U.S. Patent Documents

Reissue of:
(64) Patent No.: 7,242,082
Issued: Jul. 10, 2007
Appl. No.: 11/229,351
Filed: Sep. 15, 2005

U.S. Applications:
(63) Continuation of application No. 10/360,244, filed on Feb. 7, 2003, now Pat. No. 6,967,411.

(60) Provisional application No. 60/354,442, filed on Feb. 7, 2002, provisional application No. 60/355,955, filed on Feb. 12, 2002.

(51) Int. Cl.
*H01L 23/48* (2006.01)
*H01L 21/00* (2006.01)

(52) U.S. Cl. ..... 257/690; 257/693; 257/773; 257/776; 257/777; 257/780; 257/781; 257/784; 257/686; 257/E23.001; 257/E25.006; 257/E21.614; 438/109

(58) Field of Classification Search ..... 257/E23.001, 257/E23.085, E25.006, E25.021, E25.027, 257/E23.01–E23.079, E23.141–E23.179, 257/678–786, 787–796, E25.013, E25.018, 257/E25.614; 438/109, FOR. 368, FOR. 426; 361/760, 764, 767, 777
See application file for complete search history.

(56) References Cited

U.S. PATENT DOCUMENTS

| | | | | |
|---|---|---|---|---|
| 4,551,629 | A * | 11/1985 | Carson et al. | 250/208.2 |
| 4,672,737 | A | 6/1987 | Carson et al. | |
| 5,043,794 | A | 8/1991 | Tai et al. | |
| 5,332,922 | A | 7/1994 | Oguchi et al. | |
| 5,347,428 | A | 9/1994 | Carson et al. | |
| 5,440,171 | A | 8/1995 | Miyano et al. | |
| 5,484,959 | A | 1/1996 | Burns | |
| 5,675,180 | A | 10/1997 | Pedersen et al. | |
| 5,677,569 | A | 10/1997 | Choi et al. | |
| 5,688,721 | A | 11/1997 | Johnson | |
| 5,696,031 | A | 12/1997 | Wark | |
| 5,744,827 | A | 4/1998 | Jeong et al. | |
| 5,786,237 | A | 7/1998 | Cockerill et al. | |
| 5,973,403 | A | 10/1999 | Wark | |
| 6,023,098 | A | 2/2000 | Higashiguchi et al. | |

(Continued)

FOREIGN PATENT DOCUMENTS

JP 1991-501428 4/1993

(Continued)

OTHER PUBLICATIONS

Notice of Allowance for U.S. Appl. No. 11/825,643 mailed Dec. 14, 2009.

(Continued)

*Primary Examiner* — Jasmine Clark

(57) ABSTRACT

Layers suitable for stacking in three dimensional, multilayer modules are formed by interconnecting a ball grid array electronic package to an interposer layer which routes electronic signals to an access plane. The layers are underfilled and may be bonded together to form a stack of layers. The leads on the access plane are interconnected among layers to form a high-density electronic package.

35 Claims, 2 Drawing Sheets

U.S. PATENT DOCUMENTS

| | | | | |
|---|---|---|---|---|
| 6,028,352 | A | 2/2000 | Eide | |
| 6,052,287 | A * | 4/2000 | Palmer et al. | 361/767 |
| 6,081,026 | A | 6/2000 | Wang et al. | |
| 6,084,781 | A * | 7/2000 | Klein | 361/771 |
| 6,271,598 | B1 | 8/2001 | Vindasius et al. | |
| 6,303,992 | B1 | 10/2001 | Van Pham et al. | |
| 6,323,060 | B1 | 11/2001 | Isaak | |
| 6,365,978 | B1 | 4/2002 | Ibnabdeljalil et al. | |
| 6,639,416 | B1 | 10/2003 | Akram et al. | |
| 6,787,921 | B2 | 9/2004 | Huang | |
| 6,818,977 | B2 | 11/2004 | Poo et al. | |
| 6,967,411 | B2 | 11/2005 | Eide | |
| 7,511,369 | B2 | 3/2009 | Keith et al. | |
| 7,652,362 | B2 | 1/2010 | Jung et al. | |
| 2002/0048849 | A1 | 4/2002 | Isaak | |
| 2002/0061665 | A1 | 5/2002 | Batinovich | |
| 2002/0076919 | A1 | 6/2002 | Peters et al. | |
| 2002/0094603 | A1 | 7/2002 | Isaak | |
| 2002/0105083 | A1 | 8/2002 | Sun et al. | |
| 2003/0043650 | A1 | 3/2003 | Kato | |
| 2003/0173673 | A1 | 9/2003 | Val | |
| 2003/0232460 | A1 | 12/2003 | Poo et al. | |
| 2004/0012078 | A1 | 1/2004 | Hortaleza | |

FOREIGN PATENT DOCUMENTS

| | | |
|---|---|---|
| JP | 2001-085606 | 3/2001 |
| JP | 2001-223325 | 8/2001 |
| JP | 2003-188312 | 7/2003 |
| WO | WO 92/06904 | 4/1992 |
| WO | WO 98/31738 | 7/1998 |
| WO | WO 03/038861 | 5/2003 |
| WO | WO 2005/018000 | 2/2005 |

OTHER PUBLICATIONS

Office Action for Japanese Patent Application No. 2005-507894 dispatched Oct. 27, 2009. (English translation provided).

Supplementary European Search Report for European Patent Application No. 03818224.2 dated Oct. 28, 2009.

Notice of Allowance issued in U.S. Appl. No. 12/731,970 and mailed Jan. 6, 2011.

Office Action issued in Japanese Patent Application No. 2005-507894 drafted on May 18, 2009 and mailed on May 26, 2009 (English translation provided).

International Search Report for PCT/US2003/024706 mailed on Mar. 8, 2004.

Notice of Allowance issued in U.S. Appl. No. 12/731,970 and mailed Mar. 11, 2011.

Non-final Office Action issued in U.S. Appl. No. 11/825,643 and mailed on Sep. 4, 2009.

* cited by examiner

STACKABLE LAYER CONTAINING BALL GRID ARRAY PACKAGE

Matter enclosed in heavy brackets [ ] appears in the original patent but forms no part of this reissue specification; matter printed in italics indicates the additions made by reissue.

REFERENCE TO RELATED APPLICATIONS

[This application is a continuation of U.S. patent application Ser. No. 10/360,244 filed Feb. 7, 2003, U.S. Pat. No. 6,967,411, entitled "Stackable Layers Containing Ball Grid Array Packages", which in turn claims priority to provisional application No. 60/354,442 filed Feb. 7, 2002 and provisional application No. 60/355,955 filed Feb. 12, 2002.] *This is a broadening Reissue application of U.S. patent application Ser. No. 11/229,351, filed Sep. 15, 2005 (now U.S. Pat. No. 7,242,082, granted Jul. 10, 2007). U.S. patent application Ser. No. 11/229,351 is a continuation of U.S. patent application Ser. No. 10/360,244, filed on Feb. 7, 2003 (now U.S. Pat. No. 6,967,411), which in turn claims priority to U.S. Provisional Patent Application No. 60/354,442, filed on Feb. 7, 2002, and to U.S. Provisional Patent Application No. 60/355,955, filed on Feb. 12, 2002.*

BACKGROUND OF THE INVENTION

1. Field of the Invention

The present invention relates to the dense packaging of electronic circuitry and specifically to the stacking of ball grid army (BGA) integrated circuit packages. The invention is also suitable for the stacking of fine ball grid array (FBGA) integrated circuit packages, micro-ball grid array packages and for bump-bonded bare die to form stackable layers which can be combined to form multi-layer electronic modules.

2. Description of the Background Art

The electronics industry continues to seek smaller, denser electronic packaging. An important advance in this regard has been the use of three-dimensional packaging techniques using stacked bare or packaged integrated circuit die.

Most of the background art disclosures describe methods of stacking multiple unpackaged IC chips. Oguchi et al., U.S. Pat. No. 5,332,922, Miyano et al., U.S. Pat. No. 5,440,171, and Choi et al., U.S. Pat. No. 5,677,569, disclose methods of stacking IC chips within a single package. Jeong et al., U.S. Pat. No. 5,744,827, discloses a new type of custom chip packaging which permits stacking, but which does not allow the use of off-the-shelf packaged IC's. Burns, U.S. Pat. No. 5,484,959, shows a method of stacking TSOP packages which requires multiple leadframes attached above and below each TSOP and a system of vertical bus-bar interconnections, but which does not conveniently allow an expansion of the number of vertically interconnecting leads.

The assignee of this application, Irvine Sensors Corporation, has been a leader in developing high-density packaging of IC chips, for use in focal plane modules and for use in a variety of computer functions such as electronic memory. Examples of Irvine Sensors Corp.'s high-density electronic packaging are disclosed in U.S. Pat. No. 4,672,737, to Carson, et al.; U.S. Pat. No. 4,551,629, to Carson et al.; U.S. Pat. No. 5,688,721, to Johnson; U.S. Pat. No. 5,347,428 to Carson, et al.; and U.S. Pat. No. 6,028,352 to Eide, all of which are fully incorporated herein.

The present invention relates to the stacking of layers containing integrated circuit chips (ICs), thereby obtaining high-density electronic circuitry. In general, the goal of the present invention is to combine high circuit density with reasonable cost. A unique aspect of this invention is that it provides a low cost method of stacking commercially available IC's in BGA packages while allowing the independent routing of several non-common I/O (input/output) signals from upper-level layers to lower layers or to the bottom of the stack. Cost reduction is accomplished by utilizing relatively low cost interposer boards to reroute leads to an access plane and by the ability to stack pre-packaged and pre-tested off-the-shelf BGA packages.

None of the background art addresses the need for compact, dense memory stacks that take advantage of the high speed and small outline of a BGA package that are both low cost and highly reliable. It is therefore an object of the invention to provide a stackable layer formed from a BGA package that can be assembled at a relatively low cost and which is structurally and thermally sound. It is a further object of the invention to provide a stack of BGA layers that can provide high electronic density in a very small volume and which is compatible with a conventional BGA footprint on a printed circuit board. It is yet a further object of the invention to provide a low-cost method for manufacturing a stackable layer incorporating a BGA package and a method for manufacturing a stack of such layers.

SUMMARY OF THE INVENTION

The present invention provides stackable layers which may be interconnected to form a high-density electronic module. This application further discloses a stack of layers electrically interconnected in the vertical direction, suitable for mounting onto a PCB (printed circuit board) or other electronic device. This application further discloses a method for starting with standard BGA packages and manufacturing a stacked IC-containing package using interposer interconnections which are routed in the vertical direction along one or more access planes.

The invention generally consists of BGA packaged die that are electrically interconnected to conductive traces on an interposer board formed from a dielectric material. The interposer board serves to reroute electronic signals from the BGA to the periphery, or access edge, of the interposer. The interposer may have a single layer or multiple layers of conductive traces much like conventional printed circuit board technology.

The BGA package is solder-reflowed to the interposer and under-filled with an epoxy to form a stackable layer. The formed individual layers may then be aligned and bonded to form a multi-layer structure which includes at least one access plane. The conductive traces that terminate at the access edges are lapped and exposed, then rerouted to the desired locations to allow the interconnection of several non-common signals (e.g., chip enable and/or data lines) from an upper layer to a lower layer of a stack of layers.

DETAILED DESCRIPTION OF THE INVENTION

Figure 1A:
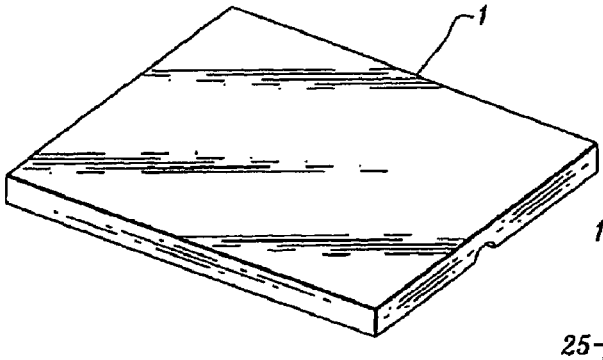
FIGS. 1A and 1B are a perspective view of ball grid array integrated circuit chip package illustrating, respectively, the top of the package and the ball grid array on the underside thereof.
Figure 1B:
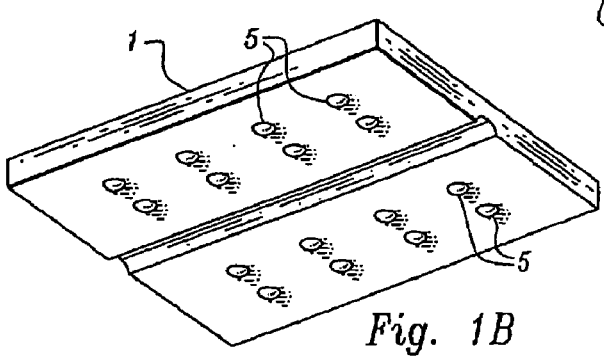

Referring now to the figures where like numerals designate like elements among the several views, FIGS. 1A and 1B show the top and underside, respectively, of a conventional ball grid array (BGA) packaged memory device 1 which includes solder balls 5 for electrical communication of signals and power into and out of the BGA package. Conventional BGA memory packages in fine grid array or micro grid array are readily available from a variety of commercial sources such as MICRON TECHNOLOGIES, INC. or SAMSUNG CORP.

Figure 2:
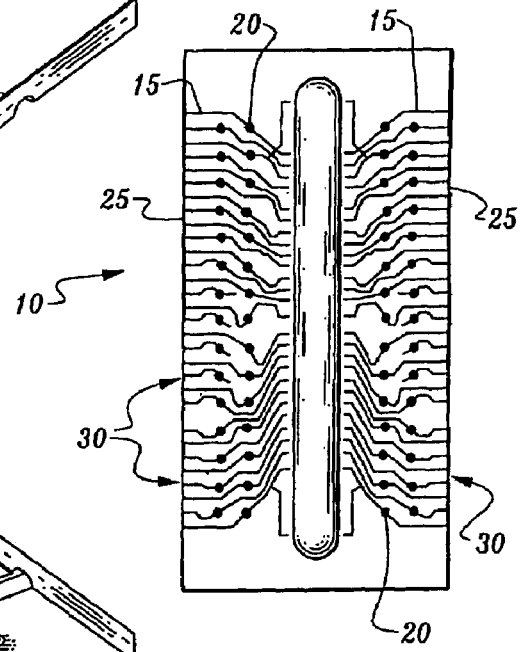
FIG. 2 plan view of an interposer board with exemplar conductive traces, access leads and solder ball pads formed thereon.

FIG. 2 illustrates an interposer board 10 made of a dielectric material such as BT Resin from Mitsubishi and includes conductive traces 15. Conductive traces 15 include solder ball pads 20 for the receiving of solder balls 5. Conductive traces lead to and terminate at an access edge 25 on the interposer board to form access leads 30.

Conductive traces made of copper or other conductive material are formed on the interposer board in a manner similar to that used in printed circuit board manufacturing. The conductive traces are patterned on the interposer board using conventional photolithography techniques so as to form solder ball pads 20 for the receiving and electrical connection of solder balls 5. The interposer board may include a single layer of conductive traces 15 or, in an alternative embodiment, multiple layers of conductive traces (not shown).

Figure 3:
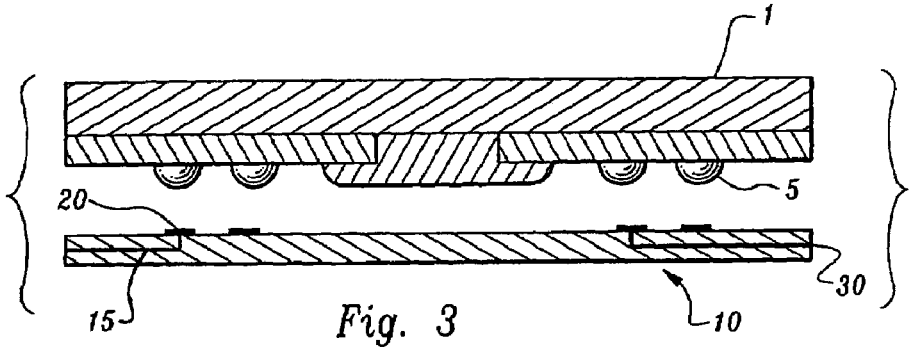
FIG. 3 is a front sectional view of a ball grid array package and interposer board showing the conductive traces, solder balls and solder ball pads.

To assemble the device, solder balls 5 of BGA package 1 are aligned and electrically connected to solder ball pads 20 as is shown in FIG. 3. An alternative embodiment includes the use of fine grid BGA packages or even bare die that include ball bonds or that are adapted to be received by the solder ball pads. The BGA package and interposer board are then reflow-soldered using conventional reflow solder techniques. While the solder balls will self-align with the solder ball pads during solder reflow, reflow process controls are critical during soldering, particularly when utilizing fine pitch ball grid array packages. Solder reflow process controls such as those set forth in "MICRON TECHNOLOGY INC. Technical Note TN-00-11 SMT BGA Assembly Design Recommendations" provide guidance for BGA reflow solder processes.

Figure 4:
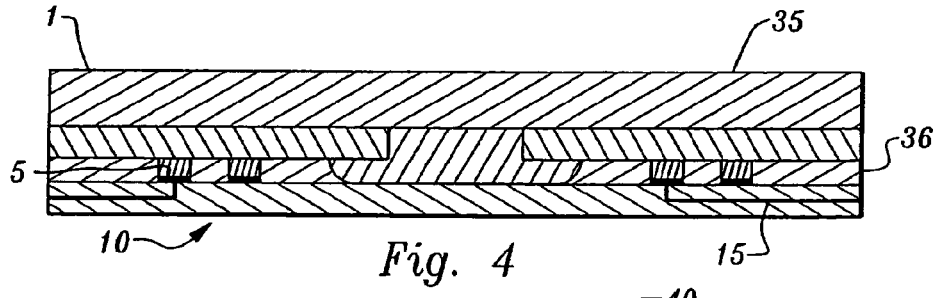
FIG. 4 is a side sectional view of a ball grid array package and interposer board after the elements have been soldered together and under-filled, creating a stackable layer.

Upon completion of the reflow process, a stackable BGA layer 35 is formed as is illustrated in FIG. 4. The layer is then preferably under-filled with a suitable under-fill material 36 such as EPOTEK U-300 to provide structural stability and to minimize temperature-related stresses due to CTE mismatch of the interposer board and BGA package. It is preferable to provide sufficient under-fill so as to extend slightly beyond the edge of the BGA package and interposer board as the under-fill eliminates voids along the access edge 25 which will be utilized as discussed further below.

Figure 5:
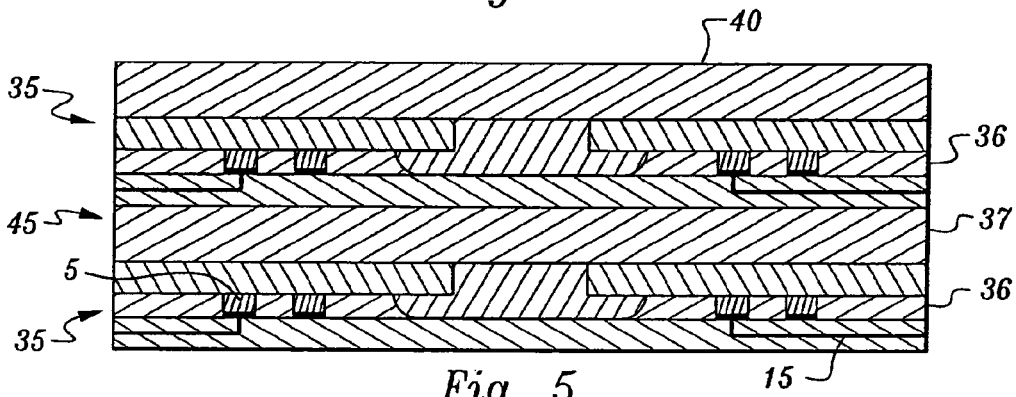
FIG. 5 is a side sectional view of a stack of layers that have been under-filled and bonded and connected a bottom interposer board.

Turning now to FIG. 5, multiple layers 35 may be bonded together using a suitable adhesive or epoxy 37 such as EPOTEK 353 to form a three-dimensional stack 40 of layers 35, forming at least one access plane 45.

Figure 6:
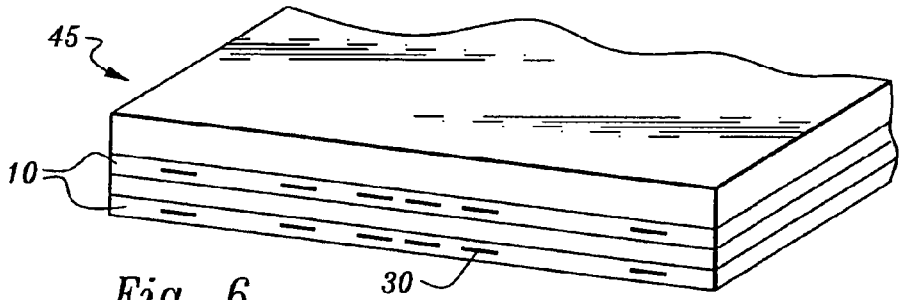
FIG. 6 shows a side view of stack of layers illustrating an access plane with access leads exposed after lapping.

Mechanical assembly of multiple layers consists generally of aligning two or more layers 35 in a suitable fixture and bonding together using the appropriate adhesive. After the adhesive has cured, the sides of stack 40 that include access leads 30, i.e., access plane 45, are ground and lapped to expose the access leads as is illustrated in FIG. 6.

Figure 7:
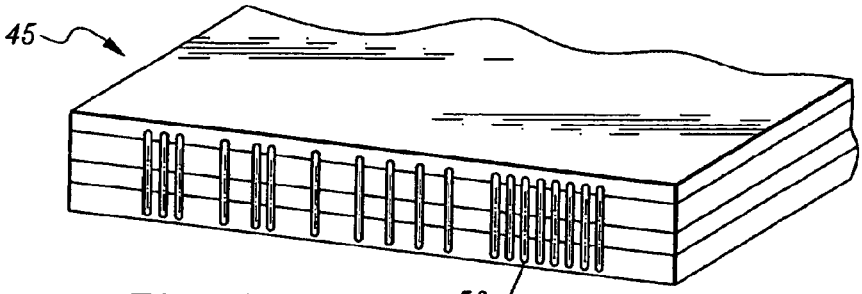
FIG. 7 shows a side view of stack of layers illustrating an access plane with access lead interconnections between access leads on different layers.

FIG. 7 shows how access leads 30 may be rerouted between layers as desired by using conventional photolithography and plating techniques to create conductive interconnecting traces 50. Alternatively, the entire access plane 45 may be metalized or coated with conductive material and the desired access leads isolated or interconnected by selectively removing conductive material using laser ablation, saw-cutting, etching or similar process. It is important that access plane be very planar with no voids to ensure the integrity of the layer interconnects. The stack is preferably encapsulated with a suitable encapsulant to protect interconnecting traces 50.

In this manner a high capacity, multi-layer module is provided that is low cost and which is readily received into existing BGA footprints.

From the foregoing description, it will be apparent the apparatus and method disclosed in this application will provide the significant functional benefits summarized in the introductory portion of the specification.

The following claims are intended not only to cover the specific embodiments disclosed, but also to cover the inventive concepts explained herein with the maximum breadth and comprehensiveness permitted by the prior art.

Many alterations and modifications may be made by those having ordinary skill in the art without departing from the spirit and scope of the invention. Therefore, it must be understood that the illustrated embodiment has been set forth only for the purposes of example and that it should not be taken as limiting the invention as defined by the following claims. For example, notwithstanding the fact the elements of a claim are set forth below in a certain combination, it must be expressly understood that the invention includes other combinations of fewer, more or different elements, which are disclosed above even though not claimed in such combinations.

The words used in this specification to describe the invention and its various embodiments are to be understood not only in the sense of their commonly defined meanings, but to include by special definition in this specification structure, material or acts beyond the scope of the commonly defined meanings. Thus, if an element can be understood in the context of this specification as including more than one meaning, then its use in a claim must be understood as being generic to all possible meanings supported by the specification and by the word itself.

The definitions of the words or elements of the following claims are, therefore, defined in this specification to include not only the combination of elements which are literally set forth, but all equivalent structure, material or acts for performing substantially the same function in substantially the same way to obtain substantially the same result. In this sense it is therefore contemplated that an equivalent substitution of two or more elements may be made for any one of the elements in the claims below or that a single element may be substituted for two or more elements in a claim. Although elements may be described above as acting in certain combinations and even initially claimed as such, it is to be expressly understood that one or more elements from a claimed combination can in some cases be excised from the combination and that the claimed combination may be directed to a sub-combination or variation of a sub-combination.

Insubstantial changes from the claimed subject matter as viewed by a person with ordinary skill in the art, now known or later devised, are expressly contemplated as being equivalently within the scope of the claims. Therefore, obvious substitutions now or later known to one with ordinary skill in the art are defined to be within the scope of the defined elements.

The claims are thus to be understood to include what is specifically illustrated and described above, what is conceptually equivalent, what can be obviously substituted and also what essentially incorporates the essential idea of the invention.

I claim:

1. A stackable layer comprised of:

a BGA package comprising at least one I/O terminal on the underside thereof, an interposer layer bonded to said underside and having at least one electrically conductive trace disposed thereon in electrical connection with said at least one I/O terminal, wherein said BGA package and said interposer layer each have a lateral surface substantially coplanar with an access plane, said at least one electrically conductive trace terminating at said access plane to define an access lead, a metallized conductive trace defined on said lateral surface of said BGA package and on said interposer layer, said metallized conductive trace in electrical connection with said access lead and in electrical connection with external electronic circuitry.

2. The stackable layer of claim 1 wherein said metallized conductive trace is defined using a laser ablation process.

3. The stackable layer of claim 1 wherein said metallized conductive trace is defined using a photolithographic plating process.

4. The stackable layer of claim 1 wherein said metallized conductive trace is defined using a mechanical saw-cutting process.

*5. A stackable layer comprising:*

*an integrated circuit (IC) package including an input/output (I/O) terminal;*

*an interposer layer bonded to the IC package and including a first electrically conductive trace electrically connected to the I/O terminal, wherein a first surface of the IC package and a second surface of the interposer layer form a lateral surface, and wherein the first electrically conductive trace terminates at the lateral surface to define an access lead; and*

*a second electrically conductive trace on the lateral surface, wherein the second electrically conductive trace is electrically connected to the access lead.*

*6. The stackable layer of claim 5, wherein the first electrically conductive trace is further electrically connected to a solder ball pad that is configured to electrically connect to the I/O terminal.*

*7. The stackable layer of claim 6, wherein the I/O terminal comprises a solder ball.*

*8. The stackable layer of claim 7, wherein the I/O terminal is electrically connected to the solder ball pad by a solder-reflow process.*

*9. The stackable layer of claim 5, wherein the stackable layer is encapsulated by an encapsulant.*

*10. The stackable layer of claim 5, further comprising an underfill between the IC package and the interposer layer.*

*11. The stackable layer of claim 5, further comprising a plurality of conductive traces configured to electrically connect a plurality of I/O terminals of the IC package to a plurality of access leads on the lateral surface.*

*12. The stackable layer of claim 5, wherein the IC package is a ball grid array (BGA) package.*

*13. A method comprising:*

*bonding an integrated circuit (IC) package to an interposer layer;*

*electrically connecting an input/output (I/O) terminal disposed on the IC package to a first electrically conductive trace disposed on the interposer layer, wherein a first surface of the IC package and a second surface of the interposer layer form a lateral surface, and wherein the first electrically conductive trace terminates at the lateral surface to define an access lead; and*

*electrically connecting a second electrically conductive trace on the lateral surface to the access lead.*

*14. The method of claim 13, wherein the first electrically conductive trace is electrically connected to a solder ball pad that is configured to electrically connect to the I/O terminal.*

*15. The method of claim 14, wherein said electrically connecting an I/O terminal comprises:*

*aligning the solder ball pad with the I/O terminal; and*

*electrically connecting the I/O terminal to the solder ball pad via a solder-reflow process.*

*16. The method of claim 13, further comprising encapsulating the IC package and the interposer layer in an encapsulant.*

*17. The method of claim 13, further comprising depositing an underfill between the IC package and the interposer layer.*

*18. The method of claim 13, further comprising electrically connecting a plurality of conductive traces on the lateral surface to a plurality of access leads for the interposer layer.*

*19. The method of claim 13, wherein the IC package is a ball grid array (BGA) package.*

*20. A stack of electronic layers comprising:*

*a first layer including:*

*a first integrated circuit (IC) package comprising a first input/output (I/O) terminal;*

*a first interposer layer bonded to the first IC package and comprising a first electrically conductive trace electrically connected to the first I/O terminal for the first IC package, wherein a first surface of the first IC package and a second surface of the first interposer layer form a first lateral surface, and wherein the first electrically conductive trace terminates at the first lateral surface to define a first access lead; and*

*a second electrically conductive trace on the first lateral surface, wherein the second electrically conductive trace is electrically connected to the first access lead; and*

*a second layer adhered to the first layer and including:*

*a second IC package comprising a second I/O terminal;*

*a second interposer layer bonded to the second IC package and comprising a third electrically conductive trace electrically connected to the second I/O terminal of the second IC package, wherein a third surface of the second IC package and a fourth surface of the second interposer layer form a second lateral surface aligned with the first lateral surface, and wherein the third electrically conductive trace terminates at the second lateral surface to define a second access lead; and*

*a fourth electrically conductive trace on the second lateral surface, wherein the fourth electrically conductive trace is electrically connected to the second access lead.*

*21. The stack of claim 20, wherein at least one of the first or second electrically conductive traces is electrically connected to a solder ball pad that is configured to electrically connect to at least one of the first or second I/O terminals.*

*22. The stack of claim 20, wherein at least one of the first or second I/O terminals comprises a solder ball.*

*23. The stack of claim 20, wherein the stack is encapsulated by an encapsulant.*

*24. The stack of claim 20, further comprising an underfill between at least one of the first IC package and the first interposer layer or the second IC package and the second interposer layer.*

*25. The stack of claim 20, further comprising a plurality of electrically conductive traces configured to electrically connect a plurality of I/O terminals of the first and second IC packages to a plurality of access leads on the first and second lateral surfaces.*

*26. The stack of claim 20, wherein at least one of the first or second IC packages is a ball grid array (BGA) package.*

*27. A method comprising:*

*bonding a first integrated circuit (IC) package to a first interposer layer to form a first stackable layer;*

*electrically connecting a first input/output (I/O) terminal disposed on the first IC package to a first electrically conductive trace disposed on the first interposer layer, wherein a first surface of the first IC package and a second surface of the first interposer layer form a first lateral surface, and wherein the first electrically conductive trace terminates at the first lateral surface to define a first access lead;*

*electrically connecting a second electrically conductive trace on the first lateral surface to the first access lead;*

*bonding a second IC package to a second interposer layer to form a second stackable layer;*

*electrically connecting a second I/O terminal disposed on the second IC package to a third electrically conductive trace disposed on the second interposer layer, wherein a first surface of the second IC package and a second surface of the second interposer layer form a second lateral surface aligned with the first lateral surface, and wherein the third electrically conductive trace terminates at the second lateral surface to define a second access lead;*

*electrically connecting a fourth electrically conductive trace on the second lateral surface to the second access lead and to the second electrically conductive trace; and*

*adhering the first stackable layer to the second stackable layer to form a stack.*

*28. The method of claim 27, wherein at least one of the first or second electrically conductive traces is electrically connected to a solder ball pad that is configured to electrically connect to at least one of the first or second I/O terminals.*

*29. The method of claim 28, wherein said electrically connecting a first I/O terminal comprises:*

*aligning the solder ball pad with the first I/O terminal; and*

*electrically connecting the first I/O terminal to the solder ball pad via a solder-reflow process.*

*30. The method of claim 27, further comprising encapsulating the stack in an encapsulant.*

*31. The method of claim 27, further comprising disposing an underfill between at least one of the first IC package and the first interposer layer or the second IC package and the second interposer layer.*

*32. The method of claim 27, further comprising electrically connecting a plurality of electrically conductive traces on the first or second lateral surfaces to a plurality of access leads for the first or second interposer layers.*

*33. The method of claim 27, wherein at least one of the first or second IC packages is a ball grid array (BGA) package.*

*34. The method of claim 13, further comprising grinding the lateral surface to expose the access lead.*

*35. The method of claim 27, further comprising grinding at least one of the first or second lateral surfaces to expose at least one of the first or second access leads.*

* * * * *

UNITED STATES PATENT AND TRADEMARK OFFICE

CERTIFICATE OF CORRECTION

PATENT NO. : RE43,536 E
APPLICATION NO. : 12/500434
DATED : July 24, 2012
INVENTOR(S) : Eide It is certified that error appears in the above-identified patent and that said Letters Patent is hereby corrected as shown below:

On the title page, item (57), under "ABSTRACT", in Column 2, Line 4, delete "underfilled" and insert -- under-filled --, therefor.

In Column 1, Line 33, delete "army" and insert -- array --, therefor.

In Column 1, Line 50, delete "IC's." and insert -- ICs. --, therefor.

In Column 2, Line 4, delete "IC's" and insert -- ICs --, therefor.

In Column 2, Line 65, delete "plan" and insert -- is a plan --, therefor.

Signed and Sealed this
First Day of January, 2013

David J. Kappos

David J. Kappos
*Director of the United States Patent and Trademark Office*